United States Patent
Ainspan et al.

(10) Patent No.: US 8,779,865 B2
(45) Date of Patent: Jul. 15, 2014

(54) ULTRA-COMPACT PLL WITH WIDE TUNING RANGE AND LOW NOISE

(75) Inventors: Herschel A. Ainspan, Yorktown Heights, NY (US); John F. Bulzacchelli, Yorktown Heights, NY (US); Daniel J. Friedman, Yorktown Heights, NY (US); Ankush Goel, Los Angeles, CA (US); Alexander V. Rylyakov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 13/350,981

(22) Filed: Jan. 16, 2012

(65) Prior Publication Data

US 2012/0112842 A1    May 10, 2012

Related U.S. Application Data

(62) Division of application No. 12/702,798, filed on Feb. 9, 2010, now Pat. No. 8,183,948.

(60) Provisional application No. 61/241,941, filed on Sep. 13, 2009.

(51) Int. Cl.
*H03B 5/12* (2006.01)
*H03L 7/10* (2006.01)

(52) U.S. Cl.
CPC ............ *H03B 5/1212* (2013.01); *H03B 5/1256* (2013.01); *H03B 5/1253* (2013.01); *H03L 7/10* (2013.01); *H03L 2207/06* (2013.01)
USPC ............. 331/117 FE; 331/47; 331/48; 331/2; 331/34; 331/181

(58) Field of Classification Search
USPC ........ 331/117 R, 117 FE, 167, 46, 47, 48, 49, 331/36 L, 181, 179, 2
See application file for complete search history.

(56) References Cited

U.S. PATENT DOCUMENTS

| | | | |
|---|---|---|---|
| 5,686,864 A * | 11/1997 | Martin et al. ................. | 331/1 A |
| 6,204,734 B1 | 3/2001 | Zhang et al. | |
| 6,946,924 B2 | 9/2005 | Chominski | |
| 7,019,593 B2 | 3/2006 | Krishnasamy et al. | |
| 7,460,001 B2 | 12/2008 | Jessie | |
| 8,058,934 B2 * | 11/2011 | Rangarajan et al. ............ | 331/46 |
| 2006/0197642 A1 | 9/2006 | Hargrove et al. | |
| 2007/0146088 A1 * | 6/2007 | Arai et al. ...................... | 331/167 |
| 2008/0007366 A1 * | 1/2008 | Bevilacqua et al. .......... | 331/179 |
| 2008/0174378 A1 | 7/2008 | Cusmai et al. | |
| 2009/0051477 A1 | 2/2009 | Kamgaing | |
| 2009/0174493 A1 | 7/2009 | Jeon et al. | |

OTHER PUBLICATIONS

Tanzi, N. "Fully Integrated, Low Noise, Differential Voltage Controlled Oscillator Not Requiring a Tail Current Source or Cross Couple Transistors", May 2009, www.ip.com.
IBM, "Switchable on Chip Inductor", Aug. 2007, www.ip.com.

* cited by examiner

*Primary Examiner* — Ryan Johnson
(74) *Attorney, Agent, or Firm* — Tutunjian & Bitetto, P.C.; Anne V. Dougherty

(57) ABSTRACT

A design for an oscillator, and a PLL incorporating such an oscillator, which takes up little physical area but maintains a large tuning range and low phase noise. Two LC-tanks are nested and switched. Through tuning the inactive tank, the range of the active tank may be increased and finer tuning becomes possible.

11 Claims, 10 Drawing Sheets

ULTRA-COMPACT PLL WITH WIDE TUNING RANGE AND LOW NOISE

RELATED APPLICATION INFORMATION

This application is a divisional of co-pending U.S. patent application Ser. No. 12/702,798 filed on Feb. 9, 2010, which claims priority to provisional application Ser. No. 61/241,941 filed on Sep. 13, 2009, both of which are incorporated herein by reference in their entirety.

BACKGROUND

1. Technical Field

The present invention relates to integrated circuit designs and, in particular, to oscillators and methods for phase-locked loops.

2. Description of the Related Art

Phase-locked loops (PLLs) are used for clock signal generation in a wide variety of applications including, but not limited to, microprocessor or application specific integrated circuit (ASIC) clocking, high-speed communications, wireless, and radar. Two key parameters of a PLL are the tuning range (i.e., the range of frequencies that can be generated) and the phase noise. Another key parameter is the physical area taken up by the PLL on the chip. For high-performance applications, phase noise requirements limit the choice of the core oscillator in the PLL to LC-tank only (i.e., an oscillator comprising an inductor and a capacitor). The standard alternative to an LC-tank is a ring oscillator. Although ring oscillators have a wide tuning range and small physical area, they do not demonstrate the low noise properties that some applications call for.

The LC-tank oscillator, exclusively used in high-performance applications throughout the industry, has two main drawbacks. First, it has a relatively large size and, second, its tuning range is typically limited to 30% or 50% at most. This range is insufficient for applications targeting multiple standards and data rates.

One solution to the problem is to have two or more LC-tank oscillators in the PLL with the ability to switch between them. A significant drawback to this approach is that it can dramatically increase the physical size of the PLL. Not only is each oscillator large by itself, but the oscillators must be placed at a significant distance from one another in order to avoid destructive coupling between resonators. This prior art configuration is shown in FIG. 1. The first oscillator 10 is disposed adjacent to a second oscillator 20. As shown, there is a significant separation between the two inductors 12 and 22, often as much as one full radius. Through the combination of the second inductor and the wasted space between conductors, the physical area taken up by the PLL is greatly increased.

An alternative prior art solution is to use switched inductors, as shown in FIG. 2. FIG. 2 depicts two loops, 31 and 32, with a switch 33 that short circuits loop 32 when engaged. In this case, the length of the inductive coil is increased by the use of additional loops, controlled by switches. Such an approach improves tuning without increasing the physical area of the design, but the introduction of switches to the inductor introduces an unacceptable level of noise.

SUMMARY

The present principles are directed to oscillator circuits which exhibit low phase noise, a large tuning range, and which occupy little physical area.

According to an aspect of the present principles, there is disclosed a method for tuning a digitally controlled dual-oscillator circuit according to the present principles, including activating an oscillator having a frequency range which includes the desired frequency or, if no oscillator has a range which includes the desired frequency, activating the oscillator which has a range that is closest to the desired frequency. Next, if the desired frequency is within the range of the active oscillator, the method tunes a resonance of the active oscillator to the desired frequency and tunes a resonance of the inactive oscillator to a frequency at the extreme end of its range which is farthest from the desired frequency.

A method for tuning a digitally controlled dual-oscillator circuit is shown that includes acquiring a desired frequency; if the desired frequency is not above an operating range of a first oscillator, activating the first oscillator, otherwise activating a second oscillator; and if the desired frequency is above the range of the active oscillator, tuning the inactive oscillator to a maximum frequency, otherwise fine tuning the inactive oscillator to produce ultra-fine tuning in the active oscillator.

A method for fine-tuning a digitally controlled oscillator is shown that includes tuning a resonance of an active oscillator to a desired frequency; and tuning a resonance of an inactive oscillator that is electromagnetically coupled to the active oscillator to fine-tune the active oscillator resonance.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Wide tuning range, compact, low phase noise synthesizers are useful for designs addressing high speed wired as well as wireless applications. According to the present principles, it is possible to construct an LC-tank-based synthesizer with a full octave of tuning range that uses nested inductors and a digital phase-locked loop (DPLL) architecture to minimize area. This nested design may be accomplished using two LC-tank oscillators of differing radius and disposing one within the other. One oscillator may be rendered active at a time, and the inactive oscillator may be tuned to produce beneficial effects in the active oscillator.

The circuits as described herein may be part of a design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1:
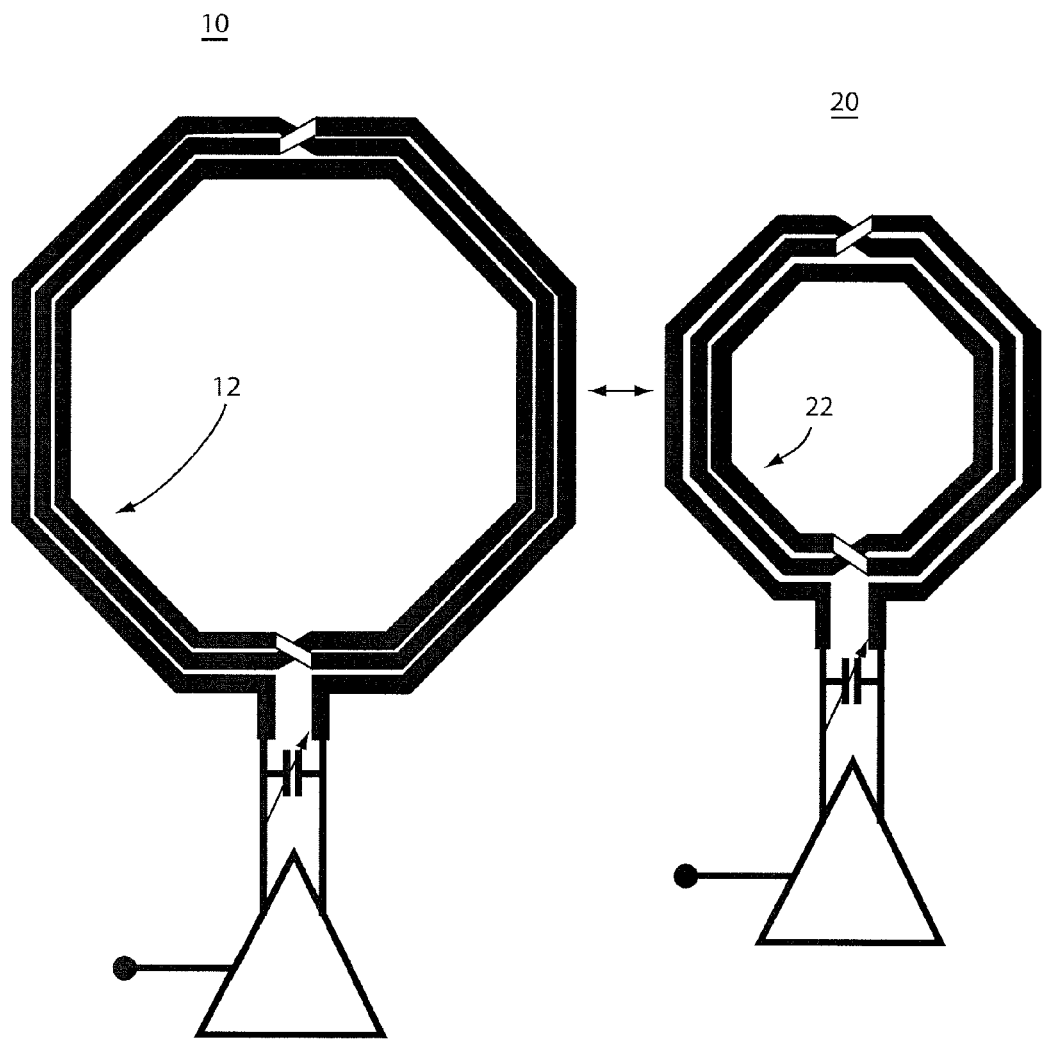
FIG. 1 is a diagram of a prior-art oscillator using two decoupled oscillators.
Figure 2:
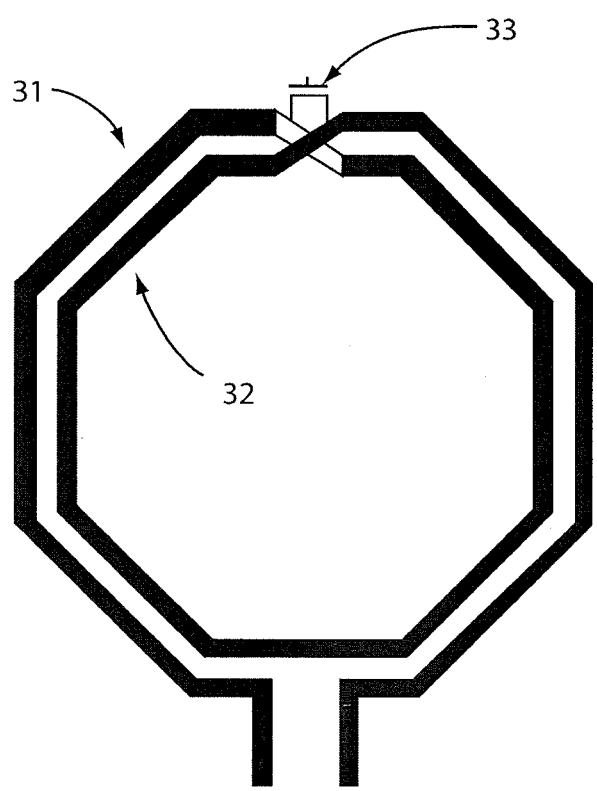
FIG. 2 is a diagram of a prior-art oscillator using a switched inductor.
Figure 3:
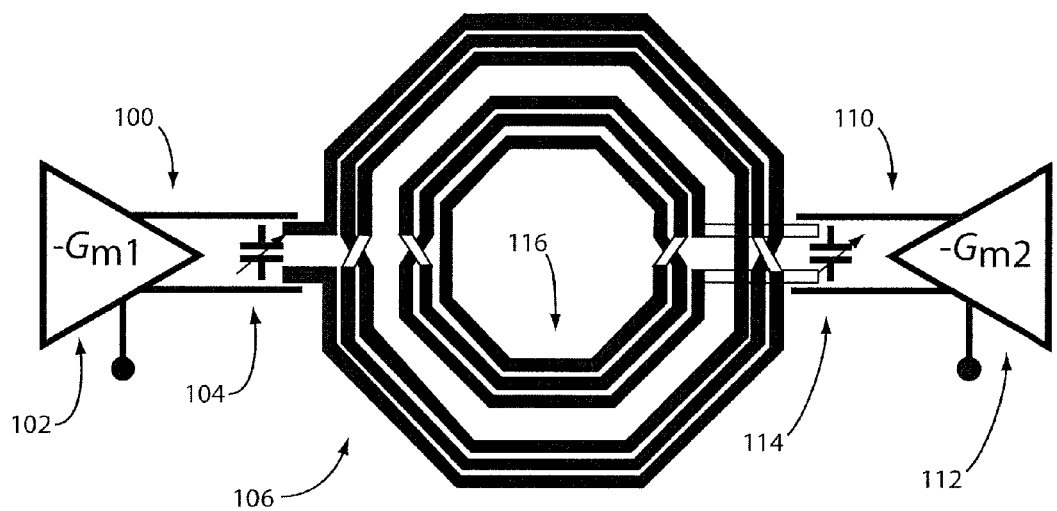
FIG. 3 is a diagram of two oscillators in a nested topology according to the present principles.

Referring now in detail to the figures in which like numerals represent the same or similar elements, and initially to FIG. 3, an embodiment in accordance with the present principles is illustratively shown. FIG. 3 depicts a nested design, wherein the inductors of two separate oscillators are disposed one within the other. As shown in FIG. 3, each oscillator (100 and 110 respectively) comprises a $-G_m$ cell (102 and 112), a variable capacitor (104 and 114), and an inductor (106 and 116). The $-G_m$ cells compensate for losses in the resonators due to resistances in the inductors. As a result, the $-G_m$ cells maintain oscillation in the LC tanks. The inductors 106 and 116 have different radii and, hence, different inductances. The frequency range of each oscillator 100 and 110 is limited by the variable capacitor's capacitance range and, in a complementary metal-oxide-semiconductor process (CMOS), a ratio between a maximum capacitance and a minimum capacitance for high-Q varactors is limited. Because each oscillator's (100, 110) inductance is provided by its geometry, variations in the frequencies of the LC-tanks depend on the square root of their capacitances. As such, large changes in the capacitance are needed to produce the desired range, and many varactors are deficient in this respect.

By incorporating two inductors 106 and 116 of different inductance into the oscillators 100 and 110, the present principles can greatly increase the frequency range of circuits that benefit from low-noise tuning. However, because the two inductors 106 and 116 are very close together, coupling effects can detract from the Q factor of each oscillator even when one of the oscillators is switched off. The resonances of the two oscillators 100, 110 are separated as much as possible during normal operation.

A goal of the present principles is to produce a two-inductor topology that has small physical area and a large Q factor. A Q factor describes the response curve of an oscillator, where a higher Q indicates that the amplitude of response of the oscillator is more sharply peaked at the oscillator's resonant frequency.

Figure 4:
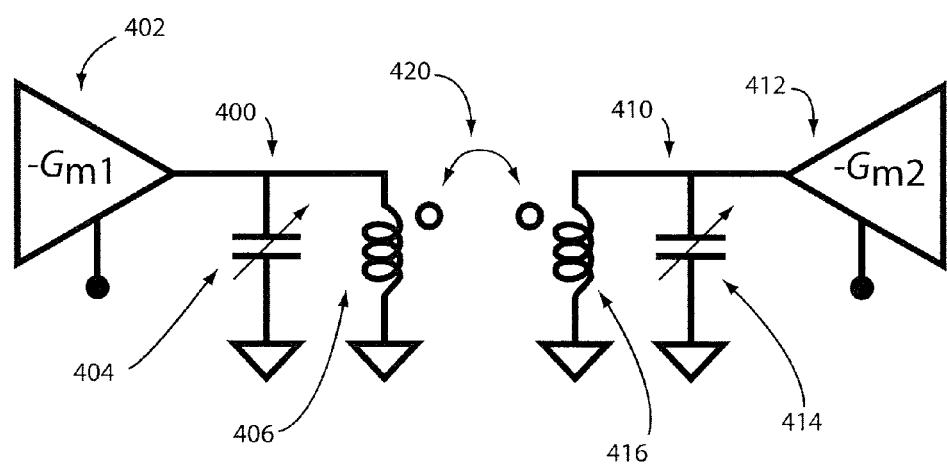
FIG. 4 is a circuit schematic describing two oscillators in a nested topology according to the present principles.

FIG. 4 shows a simplified circuit schematic for the topology described in FIG. 3. The schematic depicts two resonators, 400 and 410, $-G_m$ cells 402 and 412, variable capacitors 404 and 414, and two inductors 406 and 416 having inductance $L_1$ and $L_2$ respectively, including an inductive coupling 420 that is determined by a coupling coefficient k. The Q factor of the second resonator may be characterized as:

$$Q_2 \approx \frac{Q_{L2}(1-k^2)}{1+k^2+k^2\frac{R_s}{R_2}}.$$

In this formulation, $Q_{L2}$ represents quality factor of the inductor $L_2$, $R_S$ is the series resistance of a switch plus the series resistance of inductor $L_1$ in the first resonator, and $R_2$ is the series resistance of inductor $L_2$ in the second resonator. A typical value for $R_2$ is 1Ω, with $R_S$ typically being much higher. As such, $R_S$ should be minimized to avoid a reduction in the effective quality factor of the second resonator. The switched, coupled oscillator arrangement produces a frequency response for the oscillators which is very close to the ideal. Furthermore, the introduction of a switch allows the resonators to be selectively enabled and disabled, resulting in the beneficial effects described below.

Figure 5:
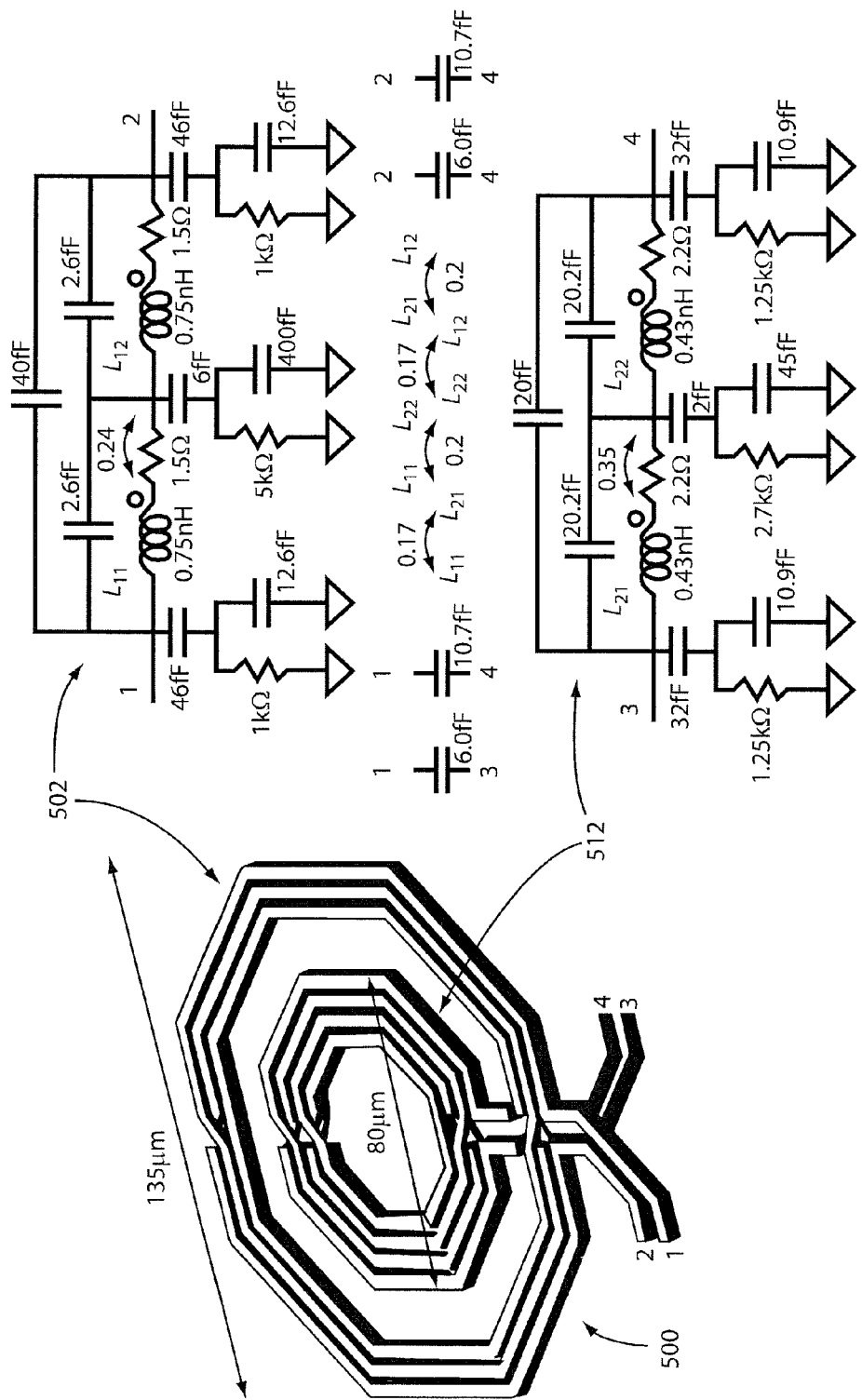
FIG. 5 is a detailed resistor-inductor-capacitor model for coupled inductors in a nested topology according to the present principles.

FIG. 5 shows a more detailed schematic of an embodiment of the present principles alongside a top-down illustrative view of the inductor coils in a resistor-inductor-capacitor (RLC) model for the coupled inductors. RLC 502 comprises a number of capacitors and resistors, as well as two inductors, $L_{11}$ and $L_{12}$, which represent one of the coils of wire seen in, e.g., FIG. 3. The resistors and capacitors of FIG. 5 simply represent the electrical properties of the loops of wire that are graphically depicted. They represent one particular embodiment of the present principles and are included solely as an example. RLC 512 comprises a similar layout, but having different values for each of the resistors, capacitors, and inductors (wherein the inductors are labeled $L_{21}$ and $L_{22}$). Numbers 1-4 are indicated on the schematics correspond to the corresponding position of the view 500. Note that the magnitudes and values of the circuit components shown in and with respect to FIG. 5 are non-limiting and have been produced to demonstrate one illustrative embodiment. In addition to the coupling coefficients described within each RLC, the following table provides a list of the coupling coefficients as between the inductors of the respective RLCs:

| $L_{11}$ - - - $L_{21}$ | $L_{11}$ - - - $L_{22}$ | $L_{12}$ - - - $L_{21}$ | $L_{12}$ - - - $L_{22}$ |
|---|---|---|---|
| 0.17 | 0.2 | 0.17 | 0.2 |

In addition, the parasitic capacitances between terminals 1 and 2 and terminals 3 and 4 are shown below in table 2:

| $C_{13}$ | $C_{14}$ | $C_{24}$ | $C_{23}$ |
|---|---|---|---|
| 6.0 fF | 10.7 fF | 6.0 fF | 10.7 fF |

An exemplary diameter for the inductors of the first RLC is 135 μm, whereas the second RLC's inductors may have an exemplary diameter of 80 μm and fit entirely within the first. While generally circular shapes are preferred, other shapes may be employed. Nesting the inductors 512 and 502 and on a single plane has the immediate effect of saving an area of roughly 5,000 μm$^2$ from the area of the second inductor 512, in this example, in addition to avoiding the wasted space that results from spacing the inductors far apart from one another.

Figure 6A:
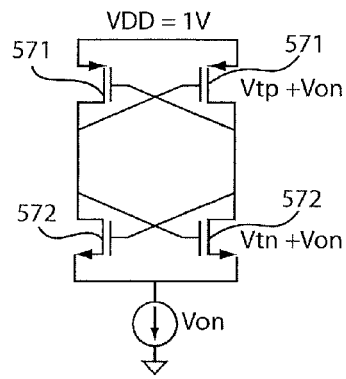
FIGS. 6A-G depict various possible embodiments for a $-G_m$ cell according to the present principles.

Referring to FIGS. 6A-G, a plurality of possible configurations are illustratively shown for $-G_m$ cell s 102 and 112 according to the present principles. FIG. 6A shows a simple amplifier with a supply voltage VDD (=1 Volt) in this example. The p-type field effect transistors (PFETs) 571 conduct when a threshold voltage (Vtp) and an on voltage (Von) are achieved. The n-type field effect transistors (NFETs) 572 conduct when a threshold voltage (Vtn) and an on voltage (Von) are achieved.

Figure 6B:
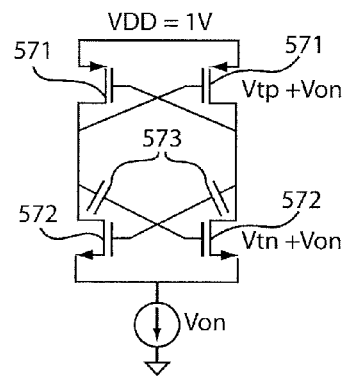
Figure 6C:
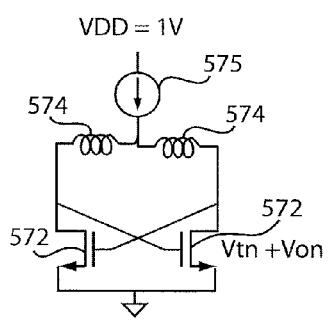
Figure 6D:
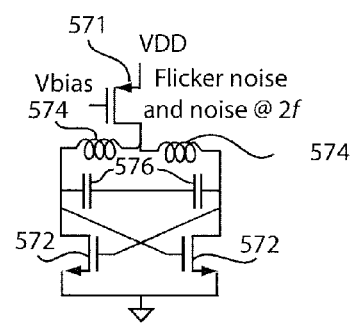
Figure 6E:
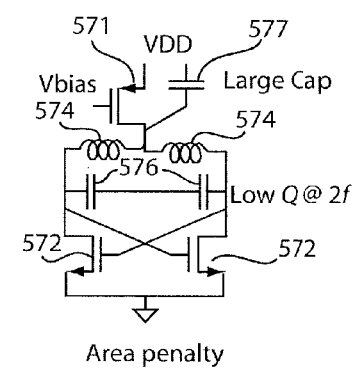
Figure 6F:
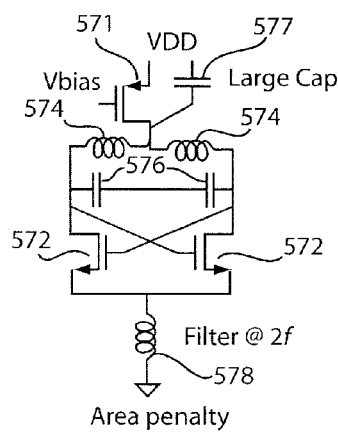
Figure 6G:
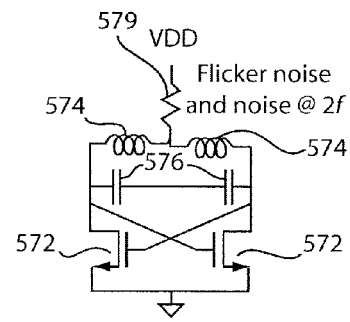

FIG. 6B shows capacitances 573 across cross-coupled NFETs 572. FIG. 6C shows the PFETs replaced with a current source 575 and inductances 574. FIG. 6D shows inductances 574 with capacitances 576, and the current source including a PFET 571. This $-G_m$ cell has flicker noises and noise at twice the operating frequency (2f). FIG. 6E provides an additional capacitor 577, has a low Q and reduced noise at 2f, but suffers an area penalty as a result of the additional capacitor 577. FIG. 6F includes an additional filter 578 at a foot of the amplifier to filter at 2f, but suffers from an additional area penalty. FIG. 6G includes a resistance 579 has no flicker noise, but has noise at 2f. Because each of the designs shown for the capacitors and $-G_m$ cells each have their own advantages and disadvantages, those having skilled in the art will readily be able to select one according to the needs of a given application. For the following embodiments, the design for a $-G_m$ cell shown in FIG. 6G is employed as an example.

Figure 7:
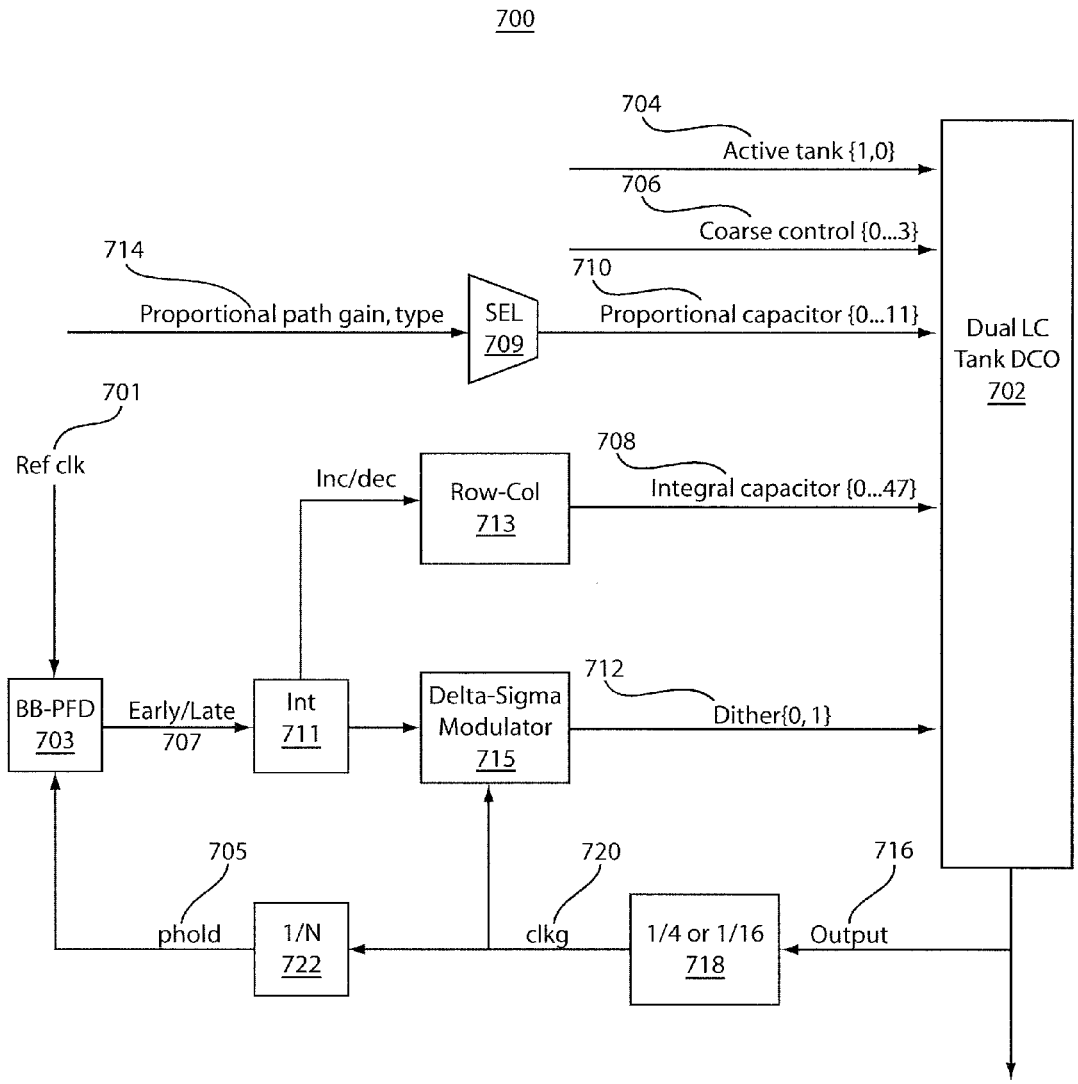
FIG. 7 is a block diagram describing a digital phase locked loop (DPLL) that employs a dual LC tank digitally controlled oscillator (DCO) according to the present principles.

Referring now to FIG. 7, a block diagram shows an illustrative embodiment of a DPLL 700 in accordance with the present principles. The values given for signals below are not intended to be limiting, but instead represent merely one possible embodiment. The architecture of this exemplary embodiment may be implemented, e.g., in a digital 45 nm semiconductor-on-insulator (SOI) CMOS process.

A phase frequency detector (PFD) 703 receives a reference clock signal 701 as well as a feedback signal 705 and produces an early/late signal 707 that compares the two signals. The early/late signal 707 is directed first to a selector 709, which selects an appropriate setting for the proportional path of the digitally controlled oscillator (DCO) 702 using the proportional path gain, type signal 714 and produces a proportional capacitor signal 710, e.g., with values ranging from zero to twelve. The proportional capacitor signal 710 actually represents two such signals, one for each of the oscillators in the DCO 702. The same holds for the other signals input to the DCO 702. In this embodiment the proportional path control 714 is used to achieve phase lock of the output signal with the input reference.

The early/late signal 707 is also directed to INT BLOCK 711. The output of INT BLOCK 711 is directed first to ROW-COL BLOCK 713, which produces an integral path signal 708 for the DCO 702, with values, e.g., ranging from zero to forty-seven. In this embodiment, INT BLOCK 711 and ROW-COL BLOCK 713 are particular examples of a means for controlling the frequency of a DCO based on a dual resonator.

The output of INT BLOCK 711 is also directed to delta-sigma modulator (DSM) 715. The DSM modulates frequency control bits to generate a one-bit dithered control signal 712 which is input to the DCO 702 to enhance the frequency resolution of the DCO 702.

The DCO 702 receives an active tank signal 704 which indicates which oscillator the dual LC-tank oscillator DCO 702 should use. In addition to the fine control provided by the proportional path signal 710 and the integral path signal 708, the DCO 702 receives a coarse control signal 706. The DCO 702 tunes its oscillators to produce a desired frequency. While one oscillator is active and one is inactive, in accordance with the active tank signal 704, the inactive oscillator may still be tuned by its respective fine and coarse tuning signals.

The DCO 702 produces an output frequency signal 716. This signal is then fed back to the DPLL 700. The frequency of the output signal 716 is first divided by four or by sixteen in block 718. The divider 718 produces clocking signal clkg 720, which is directed to DSM 715 and divider 722. Divider 722 produces a second clocking signal phold signal 705, which the PFD 703 uses to produce early/late signal 707.

Figure 8:
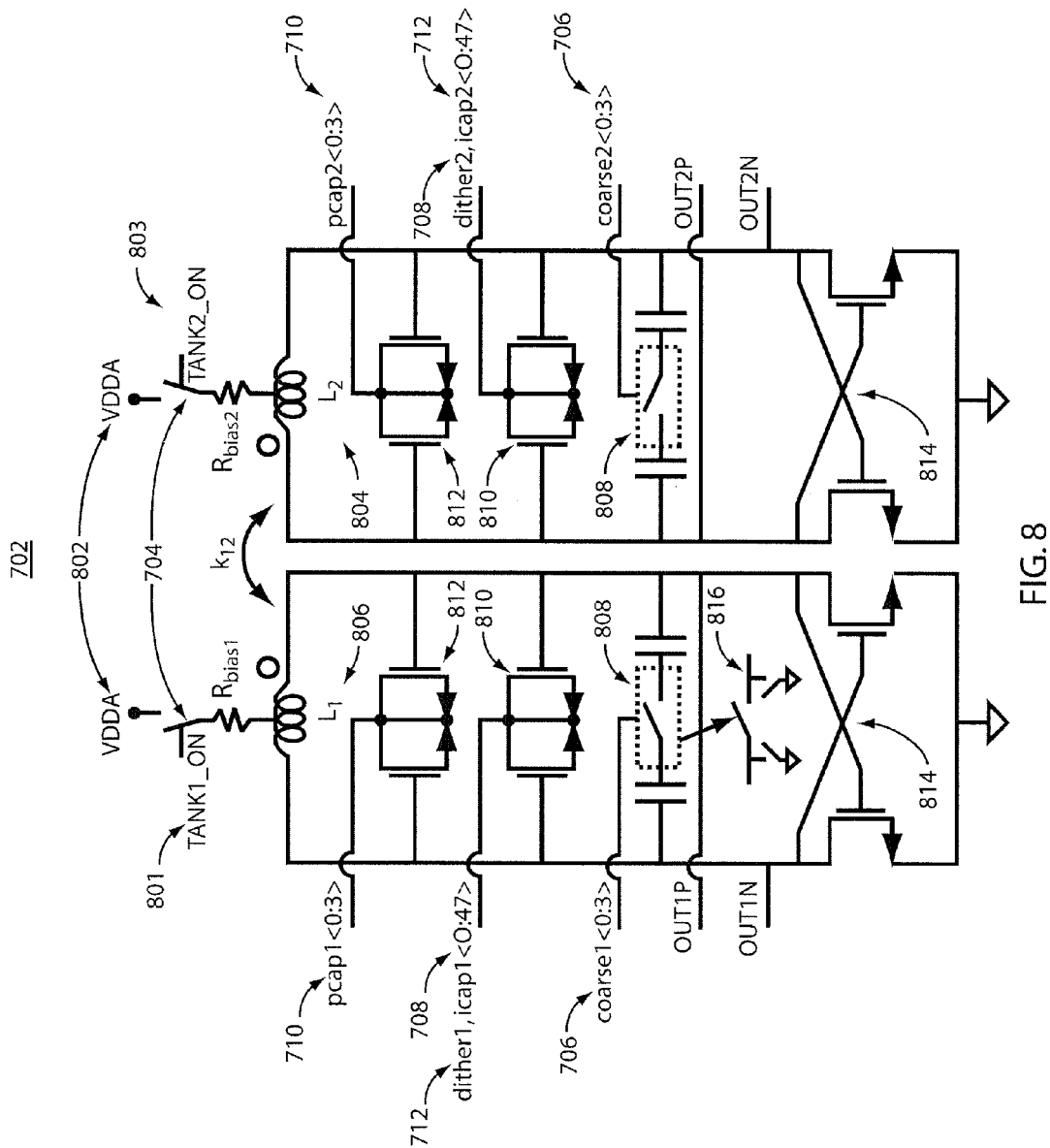
FIG. 8 is a circuit schematic describing a dual LC tank DCO according to the present principles.

Referring now to FIG. 8, the dual LC tank DCO 702 from FIG. 7 is illustratively shown in greater detail. Inductor L2 804 of the high frequency tank (TANK2) 803, having an exemplary inductance of, e.g., 1.28 nH, is placed inside inductor L1 806 of the low frequency tank (TANK1) 801, having an exemplary inductance of, e.g., 2.05 nH. An exemplary coupling factor between two inductors, used for simulation and marked in FIG. 8 as $k_{12}$, is 0.3. The coarse tuning capacitors 808 are implemented as switched sidewall metal-to-metal capacitor networks to achieve a high quality factor. The DCO 702 has, e.g., 48 thermometer-coded NFETs in nwell accumulation-mode varactors for fine integral path tuning, triggered by the icap signals 708. Each varactor 810 has an exemplary maximum capacitance of 1.59 fF and an exemplary minimum capacitance of 0.6 fF. To improve DCO resolution, one bit dithering, triggered by the dither signals 712, is used on a varactor 810 of size equal to one fine-tuning step.

For a low gain proportional path control in the DCO 702, the desired small change in tank capacitance is achieved by applying complementary early/late signals to two varactors 812 of slightly different sizes via 4 bit binary weighted inputs pcap 710. The least significant bit change in capacitance by proportional-path is, e.g., 0.024 fF.

$-G_m$ cells of the DCO may be implemented as cross-coupled NMOS pairs 814. An NMOS only topology may be chosen over CMOS topology in an exemplary embodiment to support low values of DCO power supply 802. The length of the NMOS may be chosen as, e.g., 112 nm to avoid the high flicker noise contribution by minimum length devices. Switched resistor bank 816 is used for resistive biasing to calibrate for bias current variation due to process variation. Each of the tanks 801 and 803 has its own $-G_m$ cell 814 which can be turned on by turning on the switch connecting it to power supply 802. At any given time, only one $-G_m$ cell is enabled.

Figure 9:
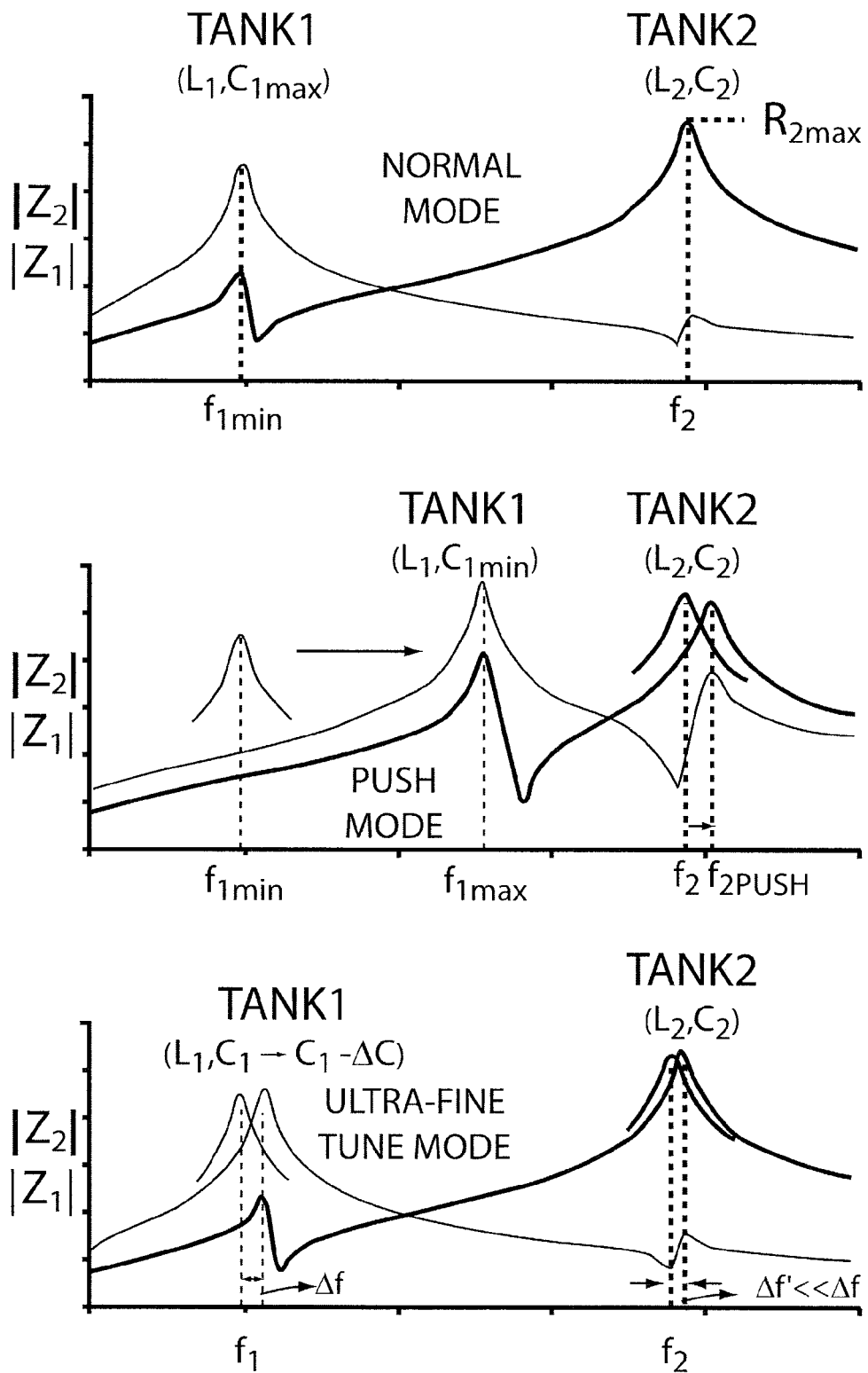
FIG. 9 shows three qualitative graphs illustrating the frequency response of an active and inactive oscillator according to the present principles under three different modes of operation.

Whereas the prior art was designed to minimize coupling, even at the cost of taking up large amounts of chip space, the present principles take advantage of coupling to boost the performance and tuning capabilities of the resonators. While only one tank is active at a time, the resonance frequency of the inactive tank can be controlled via a configuration register to produce three modes of operation for the active tank—normal mode, push mode and ultra-fine tuning mode. These modes are illustrated in FIG. 9, which shows the frequency response of the oscillators in three different configurations. TANK2 is assumed to be enabled while TANK1 is disabled. In the normal mode the resonances of the two tanks are tuned to be as different possible to reduce the loading of inactive tank on the active tank. For TANK2 operation, this is achieved by setting TANK1's capacitance such that TANK1's resonant frequency is at a minimum. This setting maximizes the quality factor of TANK2 in presence of coupling.

In the push mode, the frequency of the inactive tank is brought closer to the active tank's frequency. Due to coupling, the disabled tank pushes the frequency of the active tank beyond the range achievable in normal mode. The maximum frequency of TANK2 in FIG. 9 can be increased if the resonant frequency of the disabled TANK1 is maximized (by minimizing the strength of its capacitance). As can be seen, the increase of TANK1's resonance boosts the resonance of TANK2 from $f_2$ to $f_{2PUSH}$. The trade-off is a reduction in the quality factor of TANK2. Push mode can be used to extend the overall tuning range of the synthesizer at the expense of phase noise degradation at the extreme frequency settings.

In the ultra-fine tuning mode, fine tuning of the inactive tank can be used to achieve much smaller frequency steps in the active oscillator. This mode can be used to increase the frequency resolution in the active tank which is otherwise limited by the finite number of the digital control wires that can go into a low noise widely tunable DCO. For example, in FIGS. 7 and 8, this number is 48. It can be seen from FIG. 9 that a change of $\Delta f$ in the resonances of TANK1 produces a change $\Delta f'$ in the resonance of TANK2, where $\Delta f' \ll \Delta f$. In a DPLL framework, an increase of the DCO resolution is a desired feature, enabling a reduction of the effects of the frequency quantization noise.

Figure 10:
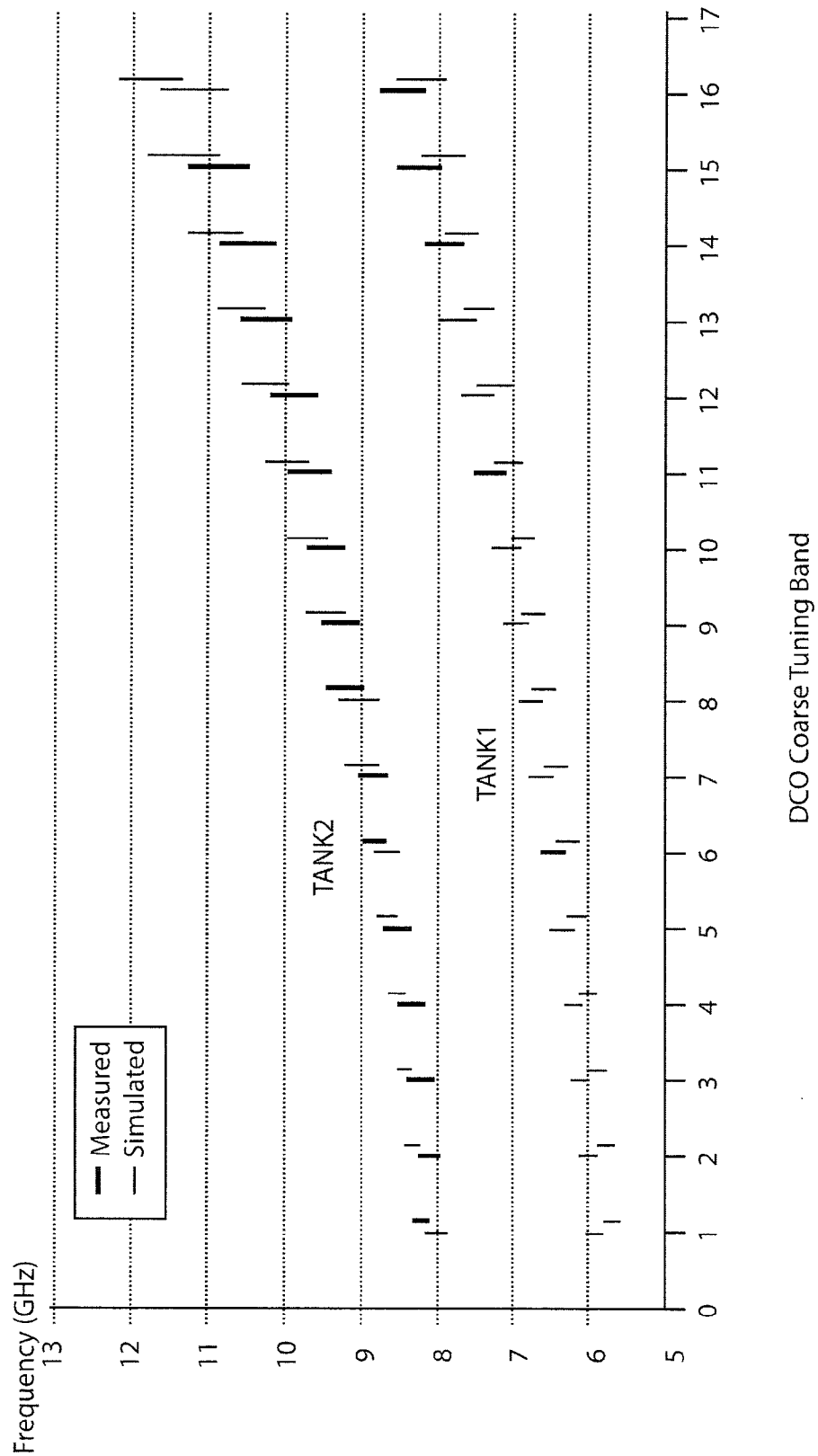
FIG. 10 shows the frequency produced by two LC-tank oscillators according to the present principles relative to the applied coarse tuning band.

A comparison of the simulated and measured DCO coarse tuning curves for the two tanks in the normal mode is shown in FIG. 10. FIG. 10 shows sufficient overlap of the two oscillators so as to produce a continuous tuning range measured at, e.g., 5.85-11.64 GHz. For comparison, the simulated tuning curves are also shown in FIG. 10. The simulations are within 5% of the measurements. Using the push mode operation, the tuning range is advantageously extended to, e.g., 5.67-12.09 GHz. The measured fine tuning resolution for TANK2 in this embodiment (enabled in coarse tuning band 16) is, e.g., 20.2 MHz. The frequency step of TANK2 (under the same settings) resulting from fine tuning of the disabled TANK1 (i.e., ultra-fine tuning mode) is, e.g., 0.7 MHz.

Figure 11:
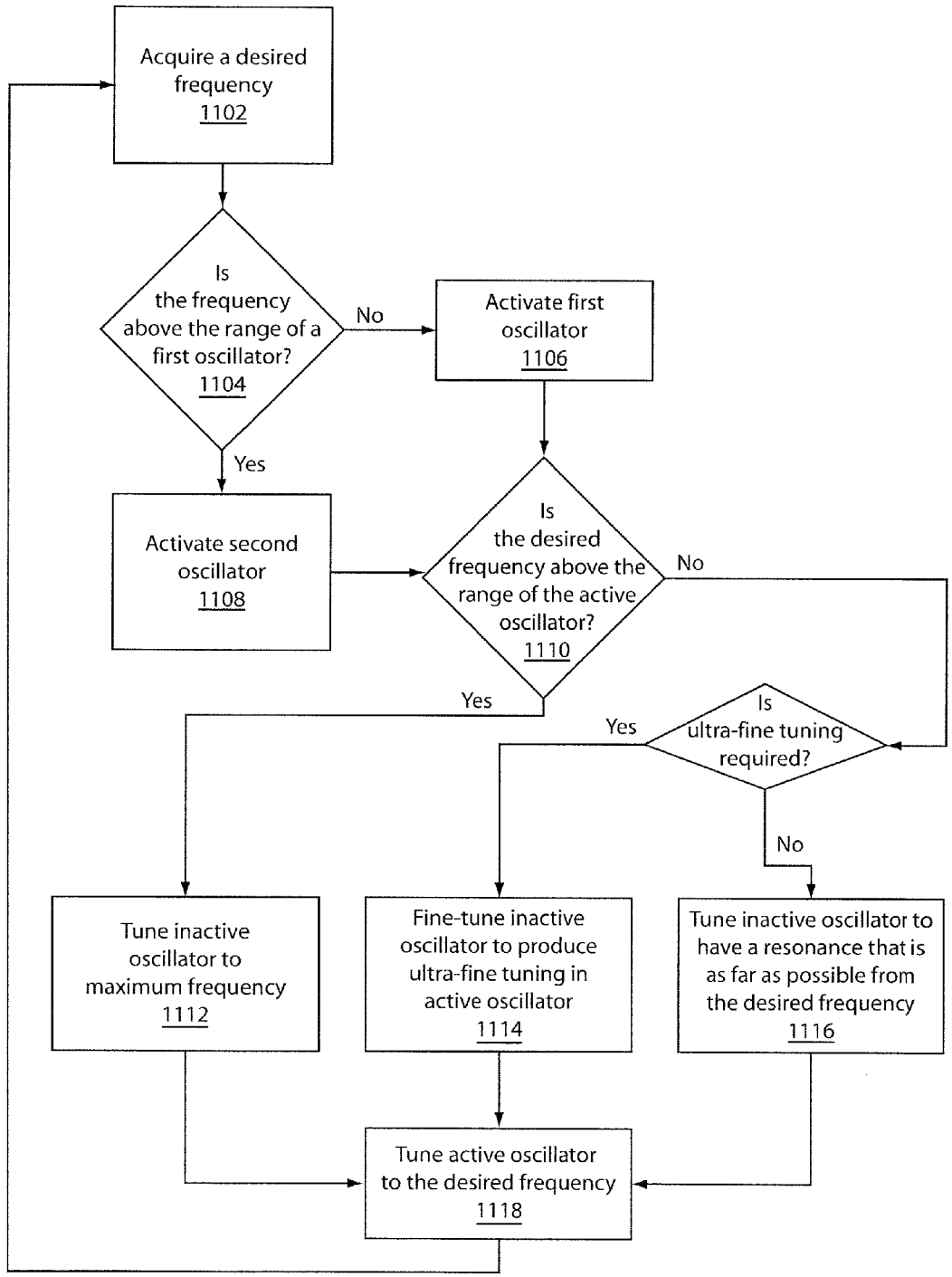
FIG. 11 shows a block/flow diagram that illustrates a method for using and tuning a dual-oscillator circuit according to the present principles.

Referring to FIG. 11, a block/flow diagram is shown which describes a method for using a dual-oscillator according to the present principles. A desired frequency is acquired in block 1102. Block 1104 determines whether the desired frequency is above the range of a first oscillator. If the desired frequency is not above the range of the first oscillator, the first oscillator is activated in block 1106. Otherwise, the second oscillator is activated in block 1108.

The next task is to determine what the operating mode of the dual-oscillator circuit will be. As described above, the upper frequency limit of the circuit may be increased in push mode. Thus, if the desired frequency is above the range of the active oscillator, determined in block 1110, the inactive oscillator is tuned to its maximum frequency in block 1112. If push mode is not required, block 1114 determines whether ultra-fine tuning is needed. If so, block 1114 fine-tunes the inactive oscillator, which causes ultra-fine changes in the resonance of the active circuit due to coupling effects. If neither push mode nor ultra-fine tuning is needed, block 1116 tunes the inactive frequency to have a resonance that is as far from the desired frequency as possible. Tuning the inactive oscillator away from the desired frequency minimizes the coupling between the active and the inactive oscillators. Finally, the active oscillator is tuned in block 1118 to produce the desired frequency. The method then returns to block 1102 to acquire a next desired frequency.

The present principles permit the creation of a DPLL which uses substantially less physical area while maintaining a large range, high Q factor, and low phase noise. In addition, by tuning the inactive tank, beneficial effects on the tuning of the active tank are possible due to coupling effects.

Having described preferred embodiments for an ultra-compact PLL with wide tuning range and low noise and methods for operation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for tuning a digitally controlled dual-oscillator circuit, comprising the steps of:
    if an oscillator has a frequency range which includes a desired frequency:
        activating the oscillator having said frequency range;
        tuning a resonance of the active oscillator to the desired frequency; and
        tuning a resonance of the inactive oscillator to a frequency at the extreme end of its range which is farthest from the desired frequency; and
    if no oscillator has a range which includes the desired frequency, activating an oscillator which has a range that is closest to the desired frequency and tuning a resonance of the inactive oscillator such that a resonance of the active oscillator extends beyond the range.

2. The method of claim 1, further comprising: if the desired frequency is above the range of the active oscillator, tuning the resonance of the inactive oscillator such that the resonance of the active oscillator increases.

3. The method of claim 1, further comprising: if the desired frequency rests between two tunable values for the active oscillator, fine tuning the resonance of the active oscillator by tuning the resonance of the inactive oscillator.

4. The method of claim 1, wherein the active oscillator is in a powered state and the inactive oscillator is in an unpowered state.

5. The method of claim 1, wherein the first oscillator has a first coil, the second oscillator has a second coil, and the second coil is disposed within the first coil.

6. A method for tuning a digitally controlled dual-oscillator circuit, comprising the steps of:
    acquiring a desired frequency;
    if the desired frequency is not above an operating range of a first oscillator, activating the first oscillator, otherwise activating a second oscillator; and
    if the desired frequency is above the range of the active oscillator, tuning the inactive oscillator to a maximum frequency, otherwise fine tuning the inactive oscillator to produce ultra-fine tuning in the active oscillator.

7. The method of claim 6, wherein the active oscillator is in a powered state and the inactive oscillator is in an unpowered state.

8. The method of claim 6, wherein the first oscillator has a first coil, the second oscillator has a second coil, and the second coil is disposed within the first coil.

9. A method for fine-tuning a digitally controlled oscillator, comprising the steps of:
- coarsely tuning a resonance of an active oscillator to a desired frequency; and
- fine-tuning the resonance of the active oscillator by tuning a resonance of an inactive oscillator that is electromagnetically coupled to the active oscillator, wherein tuning the resonance of the inactive oscillator is performed separately from the tuning of the active oscillator.

10. The method of claim 9, wherein the active oscillator is in a powered state and the inactive oscillator is in an unpowered state.

11. The method of claim 9, wherein the first oscillator has a first coil, the second oscillator has a second coil, and the second coil is disposed within the first coil.

\* \* \* \* \*